United States Patent [19]

Gulczynski

[11] Patent Number: 4,749,958

[45] Date of Patent: Jun. 7, 1988

[54] OPERATIONAL AMPLIFIER

[76] Inventor: Zdzislaw Gulczynski, P.O. Box 441, Winchester, Mass. 01890

[21] Appl. No.: 27,560

[22] Filed: Mar. 18, 1987

[51] Int. Cl.$^4$ ............................................. H03F 3/26
[52] U.S. Cl. ..................................... 330/273; 330/262
[58] Field of Search ............... 330/252, 255, 261, 262, 330/273, 311

[56] References Cited

U.S. PATENT DOCUMENTS 4,549,145 10/1985 van de Plassche .................. 330/273

Primary Examiner—Gene Wan

[57] ABSTRACT

The invention relates to an operational amplifier, particularly for signal amplification requiring high accuracy and extremely high speed which includes bandwidth, slew rate and settling time. A current feedback can be implemented with a low impedance inverting input for an increased high frequency performance. The operational amplifier according to the present invention has an input stage providing a pair of output signals, thus preserving a differential nature of the input signal of the operational amplifier. A power amplifier means is coupled to the input stage for amplifying and converting the output signals thereof into a single output signal. A very high open loop gain and save phase margin are obtained with a low number of amplification stages as the input stage has inherently a high voltage gain and the output signals thereof are amplified separately, whereby the common base configuration is preferred.

20 Claims, 4 Drawing Sheets

OPERATIONAL AMPLIFIER

CROSS REFERENCE TO RELATED APPLICATIONS

This application is related to the application numbered 027,561 entitled "Power Amplifier", by the same inventor and filed on even date herewith, the content of which is hereby incorporated by reference herein.

BACKGROUND AND SUMMARY OF THE INVENTION

The invention relates to an operational amplifier (OA), particularly for signal amplification requiring high accuracy and extremely high speed which includes bandwidth, slew rate and settling time.

Two parts can be generally distinguished in every OA: the input and output stage. The input stage of the conventional OAs amplifies a differential input signal and converts it into a single signal. A high input impedance is common. However, a low impedance inverting input is provided in OAs using a current feedback for an excellent high frequency performance. An additional amplification is accomplished in the output stage which also has a low output impedance, short circuit protection, etc.

Conventional OAs comprise single-ended stages which cause a low, asymmetrical slew rate and a slow recovery from clipping.

For instance, a current source providing a fixed and mostly excessive current is employed in a stage driving the output transistors. Multiple gain stages cause cumulative phase shift, reduced phase margins, large signal transit time thru the OA and also require a limited slew rate to prevent a saturation.

The differential nature of the input signal, lost thru the conversion into the single signal in the input stage of the OA, must be regained in the output stage as the push-pull final stage is indispensable. A push-pull stage driving the output transistors requires a voltage shift and a double phase shift by 180 degrees. This contributes to a multiple pole roll-off and results in reduced output voltage swing, greatly impaired stability, instabilities with load fluctuations, etc.

The invention is intended to solve the above problems and therefore the object of the invention is to provide an OA having high accuracy, extremely high speed and a very low number of components. According to the invention an OA with an input stage providing a pair of output signals, and an adequate output stage coupled thereto solves these problems. Specifically, an OA according to the present invention includes a pair of transistors of opposite conductivity types, each having a pair of electrodes and a collector, means for applying an input signal of the OA to at least one of the electrodes of each transistor, means for coupling together at least one of the electrodes of each transistor; and a power amplifier means for amplifying signals appearing at the collectors of the transistors and providing an output signal of the OA.

In one embodiment the OA comprises a first and second transistors of opposite conductivity types, each having a first and second electrodes and a collector with the second electrode of each transistor being coupled to one of the electrodes of the other transistor, a voltage follower having an input, being coupled to the first electrode of the second transistor and exhibiting such an offset voltage that the offset voltage appearing between its input and the first electrode of the first transistor is substantially equal zero, wherein an input signal of the OA is applied to the first electrode of the first transistor and the input of the voltage follower, a pair of means for biasing the first and second transistors coupled separately to the collectors thereof and a power amplifier means for amplifying signals appearing at the collectors of the first and second transistors and providing an output signal of the OA.

In another embodiment the OA comprises a first and second transistors of opposite conductivity types, each having a first and second electrodes, and a collector, a first and second voltage followers each having an input and being coupled to the second electrode of the first and second transistors respectively, wherein an input signal of the OA is applied to the first electrode of the first transistor and the input of the first voltage follower, further wherein the first electrode of the second transistor and the input of the second voltage follower are coupled in either order to the first electrode of the first transistor and the input of the first voltage follower, a pair of means for biasing the first and second transistors coupled separately to the collectors thereof, and a power amplifier means for amplifying signals appearing at the collectors of the first and second transistors and providing an output signal of the OA.

BRIEF DESCRIPTION OF THE DRAWINGS

The present invention will become more clear in conjunction with the accompanying figures of which.

Throughout the drawings, similar references denote similar parts.

DETAILED DESCRIPTION OF THE INVENTION

Figure 1:
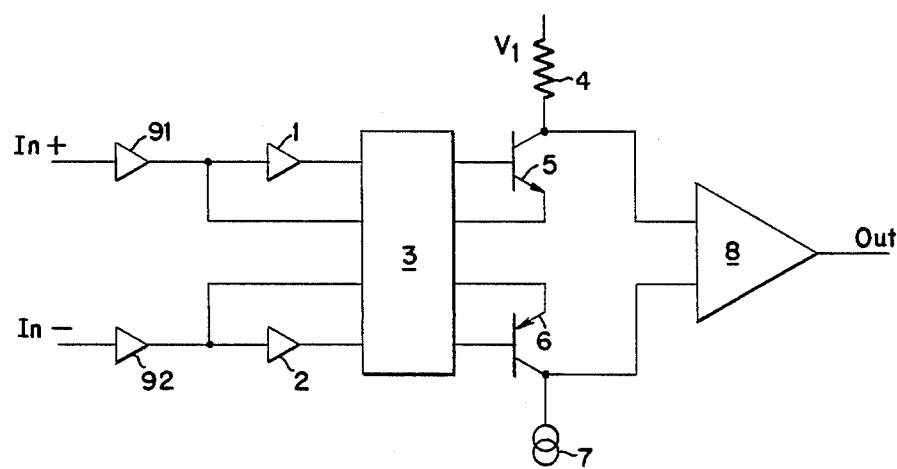
FIG. 1 is a block diagram of the present invention.

FIG. 1 is a block diagram of the present invention. The input signal is applied to the noninverting In+ and inverting In-signal inputs provided by the inputs of the voltage followers 91 and 92 respectively. The outputs thereof are further coupled to the matrix 3, directly and via voltage followers respectively 1 and 2. Further coupled to the matrix 3 are electrode pairs of the transistors 5 and 6 of opposite conductivity types and referred to as a main transistor pair. Each electrode pair is a base and emitter.

The matrix 3 couples terminals applied thereto and thus determines the configurations discussed hereinbelow. However, certain terminals providing the input signals may be unused. For instance, some configurations require only one voltage follower. The voltage followers 91 and 92 are used for increasing the input impedance of the OA and are optional in any case. The offset voltage of the voltage follower or followers is chosen in such a manner that the offset voltage appearing between the inputs In+ and In− is substantially equal zero.

The OA also comprises a pair of biasing means coupled for biasing the main transistor pair and components of the power amplifier means 8. The biasing means can be also considered as a part of power amplifier means 8 which has a pair of inputs coupled to the collectors of the main transistor pair. The resistor 4 coupled to a supply voltage source V1, and the current source 7 are shown as an example of the biasing means. No connection of the current source 7 to any voltage source is shown as the purpose of a current source is to provide a current regardless of a supply voltage.

Figure 2:
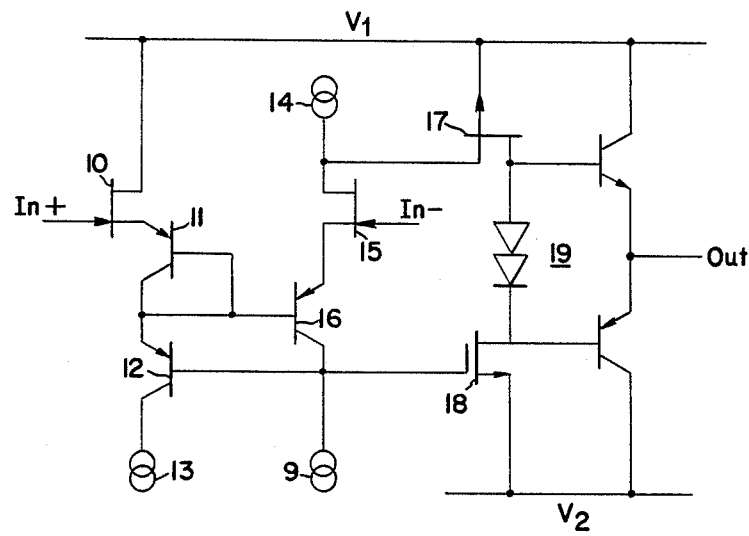
FIG. 2 is an embodiment with a separate base control.

FIG. 2 is an embodiment including the pair of the main transistors 15 and 16 whose respectively gate and base receive the input signal of the OA. The source of the n-Ch JFET 15 and the emitter of the pnp transistor 16 are coupled together. The respective drain and collector thereof are separately coupled to a pair of biasing means, which are the current sources 9 and 14, and to a pair of inputs of a power amplifier means.

A voltage follower is used having an offset voltage to compensate a voltage appearing between the gate and base of the transistors 15 and 16 respectively. Two transistors of the same type as the transistors 15 and 16 are used, respectively the JFET 10 in a source follower configuration and the transistor 11 coupled as a conducting diode. The function of the voltage follower is accomplished by the current source 13 coupled to the base and collector of the transistor 11 via the transistor 12. The optional pnp transistor 12 having base, emitter and collector coupled respectively to the collector and base of the transistor 16, and the current source 13, is used to compensate for the base current and varying base-collector voltage of the transistor 16. This improves the offset voltage and common mode rejection of the OA.

The power amplifier means comprises the p-Ch JFET 17 and n-Ch MOSFET 18 with drains coupled to an ordinary output stage 19 which consists of a complementary transistor pair having emitters coupled to the output of the PA and being biased by a dual diode coupled to the bases thereof. The transistor 17 is set in a common gate configuration and therefore has source coupled to the drain of the transistor 15, and gate coupled to the supply voltage source V1. Similarly, the transistor 18 is set in a common source configuration and therefore has gate coupled to the collector of the transistor 16, and source coupled to the supply voltage source V2. The currents of the current sources 13 and 9 are set equal. The current source 14 produces a higher current, wherein the difference is essentially the drain current flowing thru the transistors 17 and 18.

The OA according to the present invention includes means for applying the input signal thereof to at least one of the electrodes of each transistor of the main pair and means for coupling together at least one of the electrodes of each transistor. In the hereinabove described embodiments the electrodes of the main transistors which are coupled together are of similar type, i.e. bases or emitters, wherein the input signal of the OA is applied to the remaining electrodes of similar type. In the following embodiments the electrodes of the main transistors which are coupled together can be of similar or opposite types, wherein the input signal of the OA is applied to the coupled electrodes.

Figure 3:
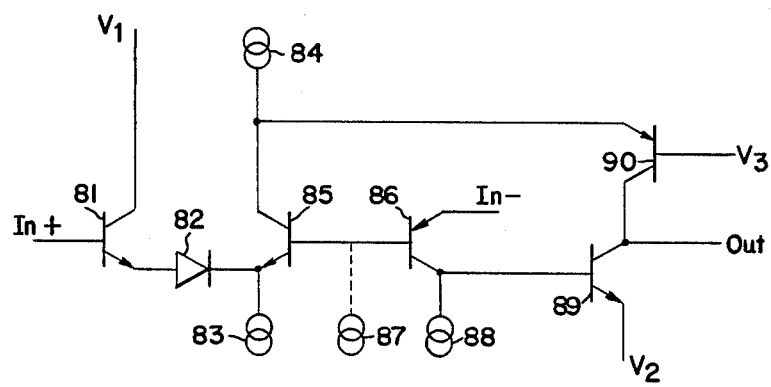
FIG. 3 is an embodiment with a separate emitter control.

FIG. 3 is another embodiment including the pair of the main transistors 85 (npn) and 86 (pnp) with the bases tied together and with the input signal of the OA applied to the emitters thereof. A voltage follower is employed to compensate for offset voltage between the inputs In+ and In− and to increase noninverting input impedance. It comprises the npn transistor 81 with the emitter coupled via the conducting diode 82 to the current source 83 and the emitter of the transistor 85.

The current source 87 coupled to the bases of the transistors 85 and 86 is optional. For instance, it can be used for base current compensation of the pnp transistor 86 which usually has a lower current gain than the npn transistor 85. Furthermore, the current source 87 is necessary when a pair of JFETs is substituted for the transistors 81 and 85. A current feedback can be accomplished as a low impedance inverting input In− is provided. A voltage follower can be coupled thereto for obtaining a high input impedance.

The collectors of the transistors 85 and 86 are coupled to a pair of biasing means. These are the current sources 84 and 88 respectively, also coupled to the inputs of the power amplifier means. This means comprises the transistors 90 (pnp) and 89 (npn) which operate in a similar manner as the transistors 17 and 18 of FIG. 2. Specifically, the base of the transistor 90 is coupled to the fixed voltage source V3. An end stage, e.g. such as 19 of FIG. 2, can be added for a higher accuracy, higher open loop gain, wider output current range, etc.

Figure 4:
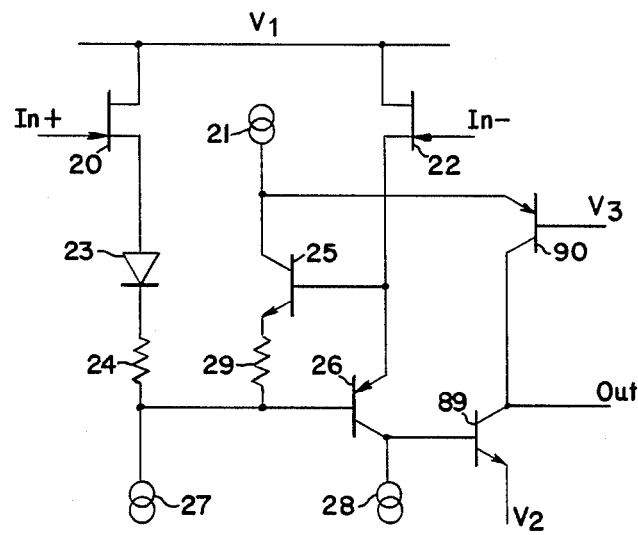
FIG. 4 is an embodiment with a direct base-emitter control.

FIG. 4 is another embodiment including the pair of the main transistors 25 (npn) and 26 (pnp) with base of each one coupled to the emitter of the other transistor and with the input signal of the OA applied thereto via a pair of voltage followers. One voltage follower comprises just the n-Ch JFET 22 with the source coupled to the base and emitter of the transistors 25 and 26 respectively.

The other voltage follower comprises the n-Ch JFET 20 with the source coupled via the conducting diode 23 to the current source 27 and to the base and emitter of the transistors 26 and 25 respectively. The diode 23 compensates for base-emitter voltage of the transistors 25 and 26. For greater stability, a resistor coupled is series with the emitter of the transistor 25 or 26, and possibly another resistor in series with the diode 23, can be used. The resistors 24 and 29 coupled in series with the diode 23 and the emitter of the transistor 25 respectively, are shown as an example.

The transistors 20 and 22 are optional. If left out, In− is a low impedance input. A high input impedance of the input In+ can be also accomplished by an npn transistor employed as a voltage follower in place of the diode 23. The collectors of the transistors 25 and 26 are coupled to a pair of biasing means. These are the current sources 21 and 28 respectively, also coupled to the inputs of the power amplifier means comprising the transistors respectively 90 and 89, as of FIG. 3. An end stage, e.g. such as 19 of FIG. 2, can be added for a higher accuracy, higher open loop gain, wider output current range, etc.

Figure 5:
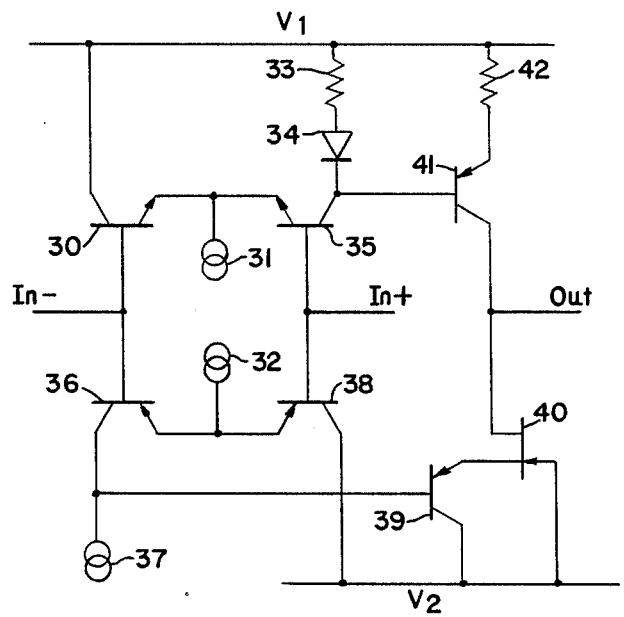
FIG. 5 is an embodiment with an indirect base-emitter control.

FIG. 5 is another embodiment including the main transistor pair 35 (npn) and 36 (pnp). The input In− is coupled to the base of the transistor 36 and to a voltage follower comprising the npn transistor 30 and the current source 31, further coupled to the emitter of the transistor 35. The input In+ is coupled to the base of the transistor 35 and to a voltage follower comprising the pnp transistor 38 and the current source 32, further coupled to the emitter of the transistor 36. An employment of matched dual transistors 30, 35 and 36, 38 is recommended for minimizing the offset voltage and common mode rejection of the OA. The input bias currents of the OA are inherently very low as the base currents of the transistors 30, 36 and 35, 38 flow in opposite directions and possibly cancel out each other.

The collector of the transistor 35 is coupled to the supply voltage source V1 via a biasing means which is the resistor 33 coupled in series with the conducting diode 34, and is further connected to an input of the power amplifier means which is the base of the pnp transistors 41. Similarly, the collector of the transistor 36 is coupled to a biasing means which is the current source 37, and is further connected to the remaining input of the power amplifier means which is the base of the pnp transistors 39. The emitter thereof is connected to the gate of the n-Ch JFET 40 operating in common gate configuration. The drain and collector of the transistors respectively 40 and 41 are coupled together for providing an output signal of the OA.

The current of the current source 31 determines the voltage across the resistors 33 and 42 as the diode 34 compensates the base-emitter voltage of the transistor 41. This resistor voltage further determines collector/drain current of the transistors 41 and 40. An end stage, e.g. such as 19 of FIG. 2, can be added for a higher accuracy, higher open loop gain, wider output current range, etc.

Figure 6:
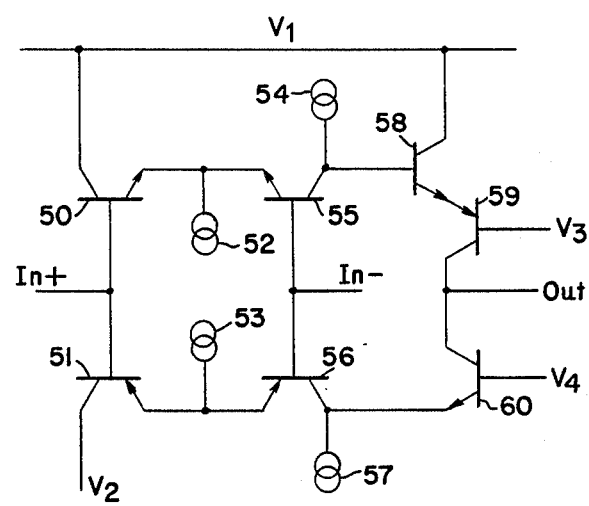
FIG. 6 is a preferred embodiment with direct base control.

FIG. 6 is a preferred embodiment including the pair of the main transistors 55 (npn) and 56 (pnp) with bases coupled together and to the input In−. In+ is coupled to a pair of voltage followers. One comprises the npn transistor 50 whose emitter is connected to the current source 52 and the emitter of the transistor 55. The other comprises the pnp transistor 51 whose emitter is connected to the current source 53 and the emitter of the transistor 56. An employment of matched dual transistors 50, 55 and 51, 56 is recommended for minimizing the offset voltage and common mode rejection of OA. The input bias currents of the OA are inherently very low as the base currents of the transistors 50, 51 and 55, 56 flow in opposite directions and possibly cancel out each other.

One biasing means is the current source 54 coupled to the collector of the transistors 55 and the base of the npn transistor 58 whose emitter is connected to the emitter of the pnp transistor 59. Another biasing means is the current source 57 coupled to the collector of the transistors 56 and the emitter of the npn transistor 60. The bases of the transistors 59 and 60 are coupled to voltage sources V3 and V4 respectively and the collectors thereof are coupled together for providing an output signal of the OA. The current of the current sources 53 and 57 determine the collector current of the transistors 58 thru 60. An end stage, e.g. such as 19 of FIG. 2, can be added for a higher accuracy, higher open loop gain, wider output current range, etc.

Figure 7:
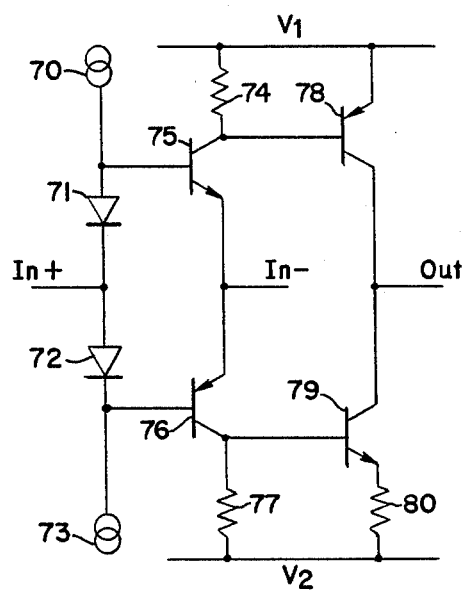
FIG. 7 is an embodiment with a direct emitter control.

FIG. 7 is another embodiment including the pair of the main transistors 75 (npn) and 76 (pnp) with emitters coupled together and to the input In−. In+ is coupled to the cathode and anode of the conducting diodes 71 and 72 respectively, each being a part of separate voltage followers. The anode and cathode of the diodes 71 and 72 are coupled to current sources 70 and 73 respectively, and bases of the transistors 75 and 76 respectively. Transistors, matched with the transistors 75 and 76 and used in place of the diodes respectively 71 and 72, are recommended for minimizing the offset voltage and common mode rejection of the OA. The input bias currents of the OA are very low as the emitter currents of the transistors 75 and 76 and the currents of the current sources 70 and 73 have opposite polarities and substantially equal values. The anode of the diode 72 and the emitter of the transistor 76 can be exchanged, whereby an adequate output stage is required.

The biasing means are the resistors 74 and 77 coupled to the collectors of the transistors 75 and 76 respectively, and the bases of the transistors 78 (pnp) and 79 (npn) respectively. The collectors of the transistors 78 and 79 are coupled together for providing an output signal of the OA. The collector current of the transistors 78 and 79 is determined by the collector current of the transistors 75 and 76, set by the current of the current sources 70 and 73. It is further stabilized by the resistor 80 coupled in series with the emitter of the transistor 79. An end stage, e.g. such as 19 of FIG. 2, can be added for a higher accuracy, higher open loop gain, wider output current range, etc.

The OA according to the present invention has an input stage providing a pair of output signals, thus preserving a differential nature of the OA input signal. The power amplifier means is coupled to the input stage and converts the output signals thereof into single output signal. Various modifications of the power amplifier means can be easily implemented by those ordinary skilled in the art, whereas numerous examples have been shown.

Current sources are recommended as biasing means for obtaining a highest possible voltage gain of the main transistor pair, and accurately determining the input current of the power amplifier means. Bipolar transistors are recommended for providing a high voltage gain. A very high open loop gain and save phase margin are obtained with a low number of amplification stages as the input stage has inherently a high voltage gain and the output signals thereof are amplified separately.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Operational amplifier, comprising:
   a first and second transistors of opposite conductivity types, each having a first and second electrodes and a collector with the second electrode of each transistor being coupled to one of the electrodes of the other transistor;
   a voltage follower having an input, being coupled to the first electrode of the second transistor and exhibiting such an offset voltage that the offset voltage appearing between its input and the first electrode of the first transistor is substantially equal zero,
   wherein an input signal of the operational amplifier is applied to the first electrode of the first transistor and the input of the voltage follower;
   a pair of means for biasing the first and second transistors coupled separately to the collectors thereof; and
   a power amplifier means for amplifying signals appearing at the collectors of the first and second transistors and providing an output signal of the operational amplifier.

2. Operational amplifier of claim 1 wherein the first and second electrodes of each transistor are a base and emitter respectively wherein the emitters are coupled together.

3. Operational amplifier of claim 2 further including a third transistor of the second transistor conductivity type, having a base and emitter being coupled respectively to the collector and base of the second transistor, and also having a collector; and further including a first current source being coupled to the collector of the third transistor, wherein the means for biasing coupled to the collector of the second transistor includes a second current source.

4. Operational amplifier of claim 1 wherein the first and second electrodes of each transistor are an emitter and base respectively and further wherein the bases are coupled together.

5. Operational amplifier of claim 4 further including a third current source being coupled to the bases of the transistors.

6. Operational amplifier of claim 1 wherein the first and second electrodes of each transistor are a base and emitter respectively and further wherein the base of each one transistor is coupled to the emitter of the other transistor.

7. Operational amplifier of claim 6 further including at least one resistor coupled in series with one of the emitters.

8. Operational amplifier of claim 1 wherein at least one of the means for biasing includes a current source.

9. Operational amplifier of claim 1 further including a second voltage follower having an input, being coupled in series with the input signal to the first electrode of the first transistor and exhibiting such an offset voltage that the offset voltage appearing between the first and second voltage follower inputs is substantially equal zero.

10. Operational amplifier, comprising:

a first and second transistors of opposite conductivity types, each having a first and second electrodes, and a collector;

a first and second voltage followers each having an input and being coupled to the second electrode of the first and second transistors respectively, wherein an input signal of the operational amplifier is applied to the first electrode of the first transistor and the input of the first voltage follower, further wherein the first electrode of the second transistor and the input of the second voltage follower are coupled in either order to the first electrode of the first transistor and the input of the first voltage follower;

a pair of means for biasing the first and second transistors coupled separately to the collectors thereof; and a power amplifier means for amplifying signals appearing at the collectors of the first and second transistors and providing an output signal of the operational amplifier.

11. Operational amplifier of claim 10 wherein the first and second electrodes of each transistor are a base and emitter in either order and further wherein the first electrodes of the first and second transistors are coupled to the inputs of the first and second voltage followers respectively.

12. Operational amplifier of claim 10 wherein the first and second electrodes of each transistor are a base and emitter in either order, wherein the first electrodes are coupled together, and further wherein the inputs of the voltage followers are coupled together.

13. Operational amplifier of claim 10 wherein at least one of the voltage followers includes a conducting diode having a first terminal providing the input of the voltage follower, and a second terminal providing an output signal of the voltage follower, and further including a current source being coupled to the second terminal of the diode.

14. Operational amplifier of claim 10 wherein the first and second voltage followers each exhibits an offset voltage substantially equal to a voltage appearing between the first and second electrodes of the first and second transistors respectively.

15. Operational amplifier of claim 10 further including a third and fourth voltage followers exhibiting substantially equal offset voltages and being coupled for applying the input signal of the operational amplifier to the first electrode of the first transistor and the input of the first voltage follower.

16. Operational amplifier of claim 10 wherein at least one of the means for biasing includes a current source.

17. Operational amplifier, comprising:

a pair of transistors of opposite conductivity types, each having a pair of electrodes and a collector;

means for applying an input signal of the operational amplifier to at least one of the electrodes of each transistor;

means for coupling together at least one of the electrodes of each transistor; and a power amplifier means for amplifying signals appearing at the collectors of the transistors and providing an output signal of the operational amplifier.

18. Operational amplifier of claim 17 wherein the pair of electrodes of each transistor includes a base and emitter, further wherein the electrodes of each transistor which are coupled together are of similar type, and still further wherein the input signal is applied to the remaining electrodes of similar type.

19. Operational amplifier of claim 17 wherein the pair of electrodes of each transistor includes a base and emitter, further wherein each electrode of one transistor is coupled to an electrode of the remaining transistor, and still further wherein the input signal is applied to the coupled electrodes.

20. Operational amplifier of claim 17 wherein the power amplifier means includes a pair of means for biasing the transistors coupled separately to the collectors thereof and further wherein at least one of the means for biasing includes a current source.

* * * * *